US006452988B1

(12) United States Patent
Hayward

(10) Patent No.: US 6,452,988 B1
(45) Date of Patent: Sep. 17, 2002

(54) ADAPTIVE SENSOR ARRAY APPARATUS

(75) Inventor: Stephen D. Hayward, Malvern (GB)

(73) Assignee: Qinetiq Limited, London (GB)

(*) Notice: Subject to any disclaimer, the term of this patent is extended or adjusted under 35 U.S.C. 154(b) by 0 days.

(21) Appl. No.: 09/344,444

(22) Filed: Jun. 29, 1999

(30) Foreign Application Priority Data

Jul. 2, 1998 (GB) ............................................ 9814237

(51) Int. Cl.[7] .......................... H01Q 3/26; H03H 21/00

(52) U.S. Cl. ....................... 375/346; 375/349; 375/350; 455/277.2; 342/162

(58) Field of Search .......................... 455/277.2, 278.1; 375/346, 349, 350; 342/162, 140

(56) References Cited

U.S. PATENT DOCUMENTS 4,641,259 A * 2/1987 Shan et al. ................. 364/724
5,548,834 A * 8/1996 Suard et al. ............. 455/276.1
5,559,757 A * 9/1996 Catipovic et al. ........... 367/134
5,627,799 A * 5/1997 Hoshuyama ................ 367/121
5,724,270 A * 3/1998 Posch ......................... 364/576
5,748,143 A * 5/1998 Melvin et al. .............. 342/162
5,907,302 A * 5/1999 Melvin ....................... 342/162
6,166,689 A * 12/2000 Dickey et al. .............. 342/381

FOREIGN PATENT DOCUMENTS

EP 700 156 * 3/1996

* cited by examiner

*Primary Examiner*—Nelson Moskowitz
(74) *Attorney, Agent, or Firm*—Nixon & Vanderhye P.C.

(57) ABSTRACT

The invention provides an adaptive sensor array apparatus (100) incorporating a multielement antenna (12) for receiving radiation from a scene ('S') and generating signals (e) in response thereto and a processing unit (114) for processing the signals (e) to provide an output signal (y). The unit (114) comprises an adaptive weight computer (136) arranged to generate weighting vectors (w) which are used in the unit (114) to attenuate contributions to the output signal (y) arising from sources of jamming radiation in the scene and transmit contributions to the output signal (y) arising from wanted targets therein. The apparatus (100) incorporates a non-adaptive beamformer unit (132) for preconditioning the signals (e) before they are passed to the computer (136). Preconditioning the signals (e) enhances performance of the apparatus (100) relative to conventional adaptive sensor array apparatus (10).

10 Claims, 5 Drawing Sheets

ADAPTIVE SENSOR ARRAY APPARATUS

BACKGROUND OF THE INVENTION

1. Field of the Invention

This invention relates to an adaptive sensor array apparatus and a method of obtaining interference rejection.

2. Discussion of Prior Art

Arrays of sensors connected to associated signal processing units are well known. The sensors generate signals in response to received radiation for subsequent processing in the units to provide output signals. Each sensor signal is scaled and phase shifted by an associated weighting vector w in a processing unit to provide a corresponding conditioned signal. Conditioned signals from the sensors are summed in the unit to provide a processed output signal therefrom in a process known as beamforming. By phase shifting and amplitude scaling each of the signals in a controlled manner prior to combining them, the processing unit exhibits in its output signal a polar gain response to received radiation comprising one or more directions of enhanced gain and one or more directions of attenuation; the directions of enhanced gain are referred to as lobes or beams of the response, and the directions of attenuation as nulls thereof. By appropriate choice of the weighting vectors w, the contributions in the output signal arising from radiation from unwanted interfering sources within a field of view in which the sensors are receptive to radiation are at least partially cancellable relative to contributions arising from radiation from wanted sources therein. For this to be possible, the wanted sources must lie in different directions to the interfering sources relative to the sensors, so that response nulls are steerable towards interfering sources and lobes towards wanted sources.

In other words, the sensors and their associated processing unit exhibit a steerable polar gain response to radiation determined by the weighting vectors w. The vectors are calculable to provide enhanced gain in directions of wanted sources and reduced gain in directions of interfering sources. Values for the vectors w are calculable automatically under computer control from the sensor signals themselves to provide at least partial rejection of contributions in the output signal from interference sources, even when directions of arrival of radiation at the array are not known a priori.; this is known as adaptive beamforming, and is described in a publication "Adaptive Array Principles" by J E Hudson, published by IEE and Peter Peregrinus, London 1981.

Apparatus incorporating arrays of sensors capable of adaptive beamforming are often operated on moving platforms such as aircraft and ships. As a result, the arrays are not always stationary with respect to wanted targets and unwanted sources of jamming and interfering radiation within fields of view of the apparatus.

There are a number of algorithms presently in use for computing the weighting vectors w described above. These algorithms rely on adjusting the vectors w gradually to track more slowly changing components of the sensor signals and assume that more rapidly changing random signal components are removed by integration and are hence not tracked. However, as disclosed in a publication "A Kalman-type algorithm for adaptive radar arrays and modelling of non-stationary weights" IEE Conference Publication, 180, 1979 by J E Hudson, the assumption may be invalid for apparatus incorporating adaptive sensor arrays operating on future agile platforms which will be capable of performing more rapid trajectory changes in comparison to current platforms.

A more general solution than the Kalman-type algorithm for coping with rapid variations in the sensor signals is described by S D Hayward in a publication "Adaptive beamforming for rapidly moving arrays", Radar 96, Beijing, China October 1996. In the solution, instantaneous weighting vectors $w_k$ for scaling the sensor signals are calculated from Eq. 1:

$$w_k = w_o + k\Delta w \qquad \text{Eq. 1}$$

where $w_k$=weighting vectors for use in scaling sensor signals to obtain an adaptive directional polar gain response;

k=a sample time within a time interval T during which the vectors $w_k$ are updated;

$w_o$=initial values of weighting vectors $w_k$; and $\Delta w$=incremental weighting vector change for rapidly tracking a scene.

In the solution, the weighting vectors $w_o$ and $\Delta w$ are calculated from a vector z using Eq.2:

$$\left[\frac{w_0}{\Delta w}\right] \equiv z \qquad \text{Eq. 2}$$

The vector z is in turn computed by solving Eq. 3:

$$Rz = \alpha C \qquad \text{Eq. 3}$$

where

C=a matrix of constraints defining mainbeam gain direction;

$\alpha$=a scalar constant chosen to satisfy the constraints C; and

R=a covariance matrix of augmented sensor signal data as provided by Eq. 4:

$$R = \frac{1}{T}\sum_{k=1}^{T}\begin{bmatrix} x_k \\ \tilde{x}_k \end{bmatrix}\begin{bmatrix} x_k^H & \tilde{x}_k^H \end{bmatrix} \qquad \text{Eq. 4}$$

where $X_k$=sensor signal data arriving at the sample time k;

$X_k$=augmenting sensor signal data including f(k) $X_k$ where f(k) is a complex data scaling function which varies with the sample time k; and H=a Hermitian transpose.

The function f(k) is chosen to match anticipated dynamic characteristics of a platform onto which apparatus implementing the solution is mounted for operation; it is often referred to as a penalty function. Although the solution can provide improved tracking of more rapidly changing scenes, it suffers a problem of providing poor cancellation of interference when there are multiple interference sources within a field of view of the apparatus. Moreover, the solution is more computationally complex than conventional solutions for adaptive beam forming.

Alternative solutions for computing the vectors w are described by Riba et al. in a publication "Robust Beamforming for Interference Rejection in Mobile Communications", IEEE Trans. Sig. Proc., Vol. 45, No. 1 January 1997 and in a publication by Gersham et al. in a publication "Adaptive Beamforming Algorithms with Robustness Against Jammer Motion", IEEE Trans. Sig. Proc., Vol. 45 No. 7, July 1997. In these alternative solutions, rapidly time-varying weighting vectors are not computed; instead, nulls in polar gain response provided by vectorially multiplying and then summing the sensor signals together are broadened in a slowly varying adaptive manner to ensure that sources of interference always lie within directions of the nulls. These alternative solutions have a disadvantage that a polar gain response of an apparatus provided thereby becomes unacceptably distorted when sources of jamming are located in a direction of a mainbeam response provided by the apparatus, or where there are multiple jamming and interference sources located in directions away from the direction of the mainbeam response where a residual polar gain sidelobe response is provided by the apparatus.

SUMMARY OF THE INVENTION

It is an object of the invention to provide an alternative adaptive sensor array apparatus providing enhanced interference rejection characteristics.

The invention provides an adaptive sensor array apparatus for generating an output signal in response to received radiation, the apparatus incorporating:

(a) multielement receiving means for generating a plurality of element signals in response to received radiation;

(b) processing means for processing the element signals to provide corresponding augmented signals in which element signals with and without such processing are grouped;

(c) adaptive computing means for adaptively computing weighting vectors from the augmented signals, and for processing the augmented signals using the weighting vectors to provide the output signal, characterised in that the processing means incorporates beamforming means for preconditioning the element signals when generating the augmented signals to enhance interference rejection characteristics of the apparatus when generating the output signal.

The invention provides the advantage of enhancing interference rejection characteristics of the apparatus by improving its performance to track sources of interference which are non-stationary relative thereto, and to attenuate its polar gain response in directions of these sources.

The beamforming means may be arranged to provide a first polar gain response for preconditioning the element signals and the apparatus may be arranged to provide a second polar gain response at its output signal, and a direction of enhanced gain in the first polar response may be aligned to a direction of enhanced gain of the second polar response. This provides an advantage against mainbeam interference jamming where the apparatus is used in a non-stationary environment.

The beamforming means may be arranged to provide a first polar gain response for preconditioning the element signals and the apparatus may be arranged to provide a second polar gain response at its output signal, and a direction of enhanced gain in the first polar response may be arranged to be substantially orthogonal to a direction of enhanced gain of the second polar response. This provides enhanced interference rejection characteristics compared to when a direction of enhanced gain in the first polar response is aligned to a direction of enhanced gain of the second polar response.

The beamforming means may be arranged to provide a first polar gain response for preconditioning the element signals and the apparatus may be arranged to provide a second polar gain response at its output signal, and a direction of enhanced gain in the second polar response may be arranged to be substantially in a direction of a null of the first polar response. This provides enhanced interference rejection characteristics compared to when a direction of enhanced gain in the first polar response is aligned to a direction of enhanced gain of the second polar response.

The processing means may be arranged to provide one or more processed signals and the apparatus may incorporate modulating means for modulating the processed signals to provide one or more modulated signals for grouping with the element signals to provide the augmented signals. This provides an advantage that modulation of the processed signals assists the computing means to compute the weighting vectors so that the apparatus is responsive to radiation from wanted regions of the scene and less responsive to radiation from unwanted regions thereof.

The apparatus may provide one modulated signal for grouping with the element signals to provide the augmented signals. This provides an advantage of reducing computation required in the computing means for calculating the weighting vectors.

The modulating means may be arranged to modulate the one or more processed signals using a signal adapted to match dynamic response characteristics of a platform bearing the apparatus.

The apparatus may incorporate analogue-to-digital converting means for digitising the element signals to provide corresponding digital signals, and the beamforming means and the computing means may be adapted to process the digital signals for generating the output signal.

The apparatus may incorporate data storing means for recording a plurality of sets of element signals, and the computing means may be arranged to calculate a corresponding set of weighting vectors from said sets of signals for use in generating said output signal.

In another aspect of the invention, a method of performing adaptive beamforming in an adaptive sensor array apparatus (100) is provided, the apparatus (100) incorporating a plurality of receiving elements (22), the method comprising the steps of:

(a) generating element signals in response to radiation received at the elements (22);

(b) preconditioning the element signals by beamforming them and then processing them to provide corresponding augmented signals in which element signals with and without such processing are grouped; and (c) adaptively computing weighting vectors from the augmented signals, and for processing the augmented signals using the weighting vectors to provide an output signal, thereby providing enhanced rejection in the output signal of contributions arising from interfering radiation received at the elements (22).

BRIEF DESCRIPTION OF THE DRAWING

In order that the invention might be more fully understood, embodiments thereof will now be described, by way of example only, with reference to accompanying drawings, in which.

DETAILED DISCUSSION OF EMBODIMENTS

Figure 1:
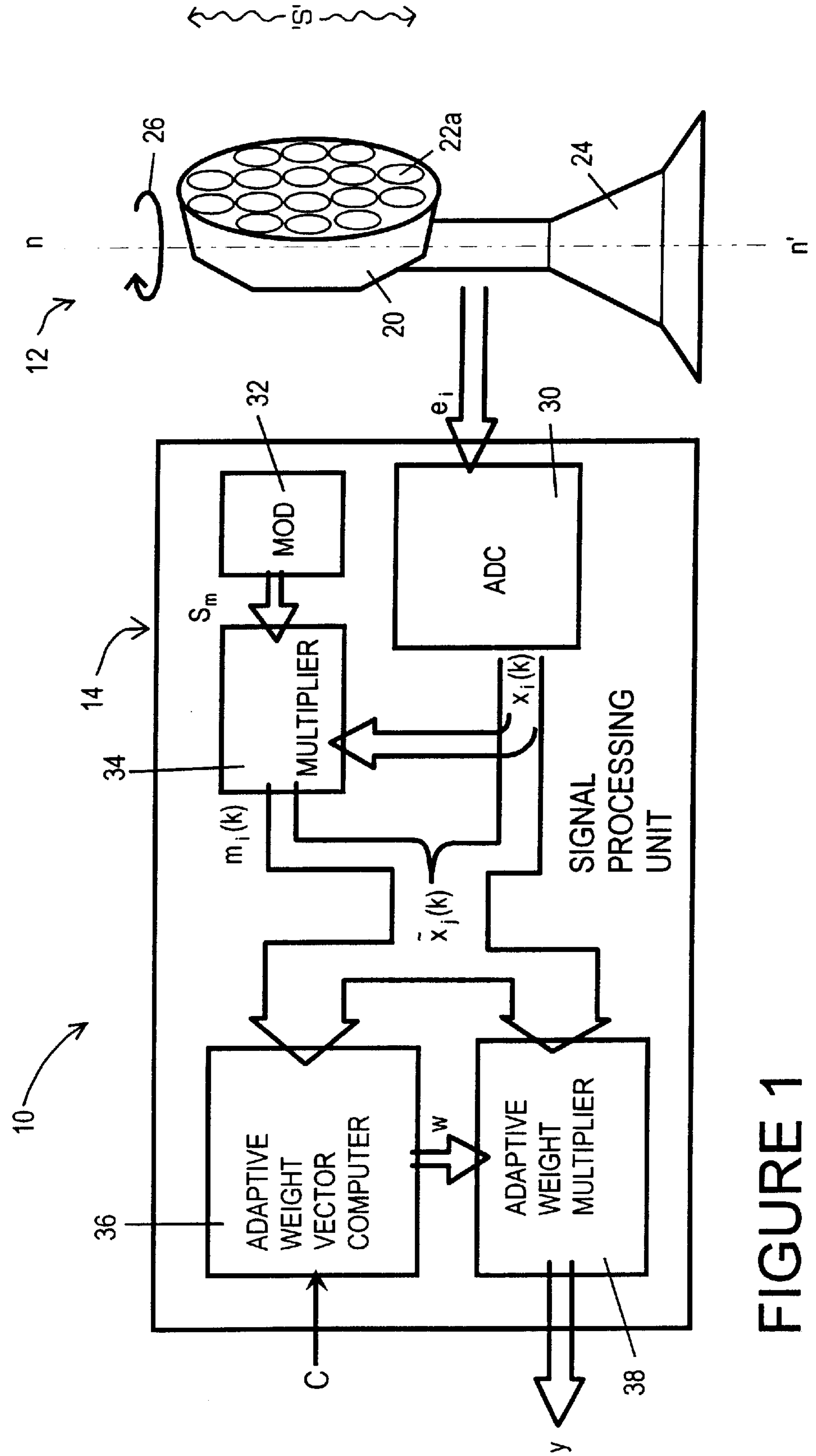
FIGURE 1 (prior art)
FIG. 1 is a schematic illustration of a prior art adaptive sensor array apparatus.

Referring to FIG. 1, a prior art adaptive sensor array apparatus is indicated generally by 10. The apparatus 10 comprises a multielement antenna indicated by 12 and a processing unit indicated by 14. The antenna 12 incorporates an array 20 of sixteen microwave antenna sensor elements 22 such as an element 22*a*. The array 20 is rotatably mounted onto a mount 24 so that the elements 22 are orientatable through 360° about an axis n–n' to receive radiation in various directions from different parts of a scene, represented by 'S', surrounding the antenna 12. Each element 22 is arranged to provide an analogue sensor output signal $e_i$ at an output which is connected to the unit 14 for processing; i is a reference index in a range of one to sixteen for identifying each element 22 uniquely.

The unit 14 incorporates an analogue-to-digital (ADC) converter unit 30, a modulation unit (MOD) 32, a multiplier unit (MULTIPLIER) 34, an adaptive weight vector computer 36 and an adaptive weight multiplier 38. The converter unit 30 is connected to the multiplier unit 34, the vector computer 36 and the weight multiplier 38 and is arranged to provide them with digital signals $x_i(k)$ where i is the reference index identifying each element 22 uniquely. The modulation unit 32 is connected to the multiplier unit 34 and is arranged to provide a modulation signal $S_m$ thereto. The multiplier unit 34 is connected to the vector computer 36 and to the weight multiplier 38 and is arranged to provide sixteen modulated digital signals $m_i(k)$ thereto, where i is the reference index for identifying each element 22 . The weight multiplier 38 incorporates an output for providing an output signal y. The signal y corresponds to radiation received at the antenna 12 from the scene 'S' in which components in the signal y arising from radiation from jamming and interfering sources therein are at least partially cancelled.

Operation of the apparatus 10 will now be described with reference to FIG. 1. In operation, the array 20 rotates relative to the mount 24 through an angle of 360° around the axis n–n' as indicated by an arrow 26, thereby fully scanning it over the scene 'S'. Each element 22 receives radiation from the scene and converts it to a corresponding sensor signal $e_i$ which is amplified and passed to the processing unit 14; i is the reference index for identifying each element 22 uniquely. In the unit 14, the converter unit 30 receives the signals $e_i$ and then digitises them to provide corresponding digitised signals $x_i(k)$ where k is a sample time.

The modulation unit 32 generates the modulation signal $S_m$ which it outputs to the multiplier unit 34. The unit 34 multiplies the digitised signals $x_i$ (k) input to it by the modulation signal $S_m$ to provide the corresponding modulated digital signals $m_i(k)$. The vector computer 36 and the weight multiplier 38 both receive the signals $x_i(k)$ and the modulated signals $m_i(k)$, represented as thirty two augmented digitised signals $x_j(k)$ in the diagram where the signals $x_1(k)$ to $x_{16}(k)$ correspond to the signals $x_1(k)$ to $x_{16}(k)$ respectively, and the signals $x_{17}(k)$ to $x_{32}(k)$ correspond to the signals $m_1(k)$ to $m_{16}(k)$ respectively. The vector computer 36 receives the augmented signals $x_j(k)$ and calculates therefrom thirty two corresponding weighting vectors w, namely each augmented signal $x_j(k)$ has computed for it a corresponding weighting vector w. The vectors w provide the apparatus 10 with an adaptive beam forming characteristic as described above for rejecting components in the signals $e_i$ arising from interfering sources in the scene 'S' and enhancing components arising from wanted sources located in a direction in which the antenna 12 provides its greatest gain, namely its main beam direction. The weight multiplier 38 receives the vectors w and performs multiplication and summation of the augmented signals $x_j(k)$ to provide the output signal y.

Processing performed in the unit 14 at least partially attenuates components in the output signal y arising from radiation received at the array 20 from unwanted sources of interfering and jamming radiation in the scene 'S'. As a result, the signal y corresponds predominantly to radiation received at the array 20 from wanted radiation emitting sources in the scene 'S'.

In order to further explain operation of the apparatus 10 shown in FIG. 1, operation of the vector computer 36 and the weight multiplier 38 will now be described in more detail. Each of the signals $x_i(k)$ is multiplied in the multiplier unit 34 by the signal $S_m$ which is chosen to match expected dynamics of a weight solution for the apparatus 10. The modulated signals $m_i(k)$ from the multiplier unit 34 together with the signals $x_i(k)$ are then input to the vector computer 36 which calculates the weighting vectors w. The vectors w are calculated in the computer 36 according to Eq. 5:

$$w = \frac{\tilde{R}^{-1}\tilde{C}}{\tilde{C}^{H}\tilde{R}^{-1}\tilde{C}}g \qquad \text{Eq. 5}$$

where

C=a matrix of constraints determining apparatus main-beam direction;

R=a covariance matrix of the augmented signals x(k);

H=a Hermitian transpose;

g=a gain vector; and

~ denotes signal augmentation.

The computer 36 outputs the weighting vectors w which are then input to the multiplier 38 which performs a multiplying and summing function for all the augmented signals x~(k) and their corresponding weighting vectors w as described by Eq. 6:

$$y = w^{H}\tilde{x}(k) \qquad \text{Eq. 6}$$

where w=the weighting vectors; and x~(k)=the augmented signals.

The output signal y corresponds to radiation emitted from the scene 'S' with contributions from radiation emitted from the interfering sources at least partially cancelled therein.

The prior art apparatus 10 shown in FIG. 1 suffers from a number of problems when performing adaptive beam steering on the basis of relatively few samples of data from the scene at relatively few sample times k, namely:

(i) it has difficulty with tracking more rapidly moving wanted targets in the scene; and (ii) its performance in nulling interfering sources in the scene 'S' is unsatisfactory because it does not steer minima of response nulls accurately.

The apparatus 10 exhibits problems especially when coping with jamming sources whose direction approaches that of wanted targets; in other words, the apparatus 10 performs unsatisfactorily when required to configure a null in its polar response relatively close to a main lobe directed towards a wanted target.

Figure 2:
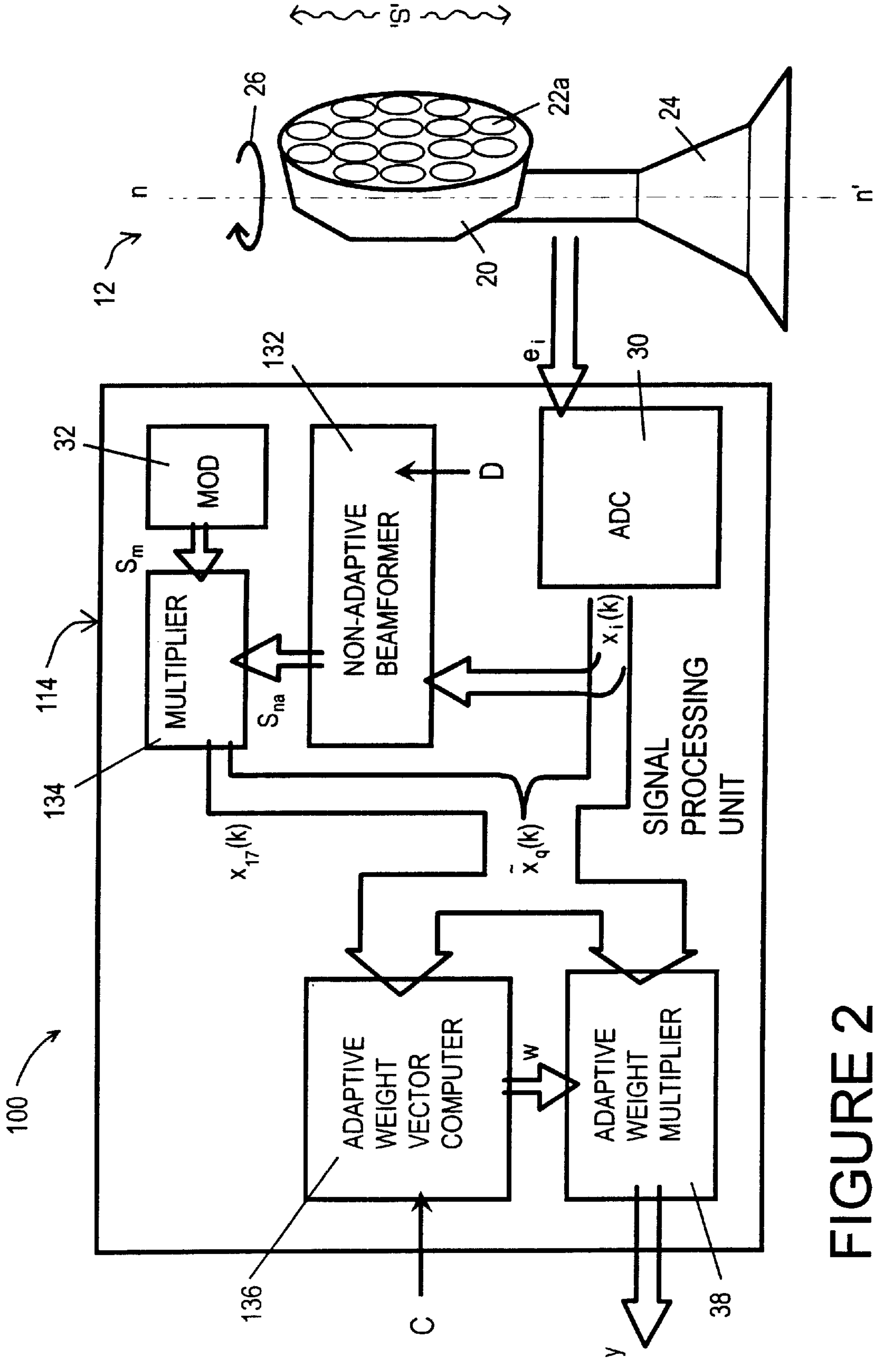
FIG. 2 is a schematic diagram of an adaptive sensor array apparatus of the invention.

Referring to FIG. 2, there is shown an adaptive sensor array apparatus of the invention indicated generally by 100. It includes the antenna 12 and a processing unit indicated by 114. The unit 114 incorporates the converter unit 30, the modulation unit 32 and the adaptive weight multiplier 38 as described above and further includes a non-adaptive beamformer unit 132, a multiplier unit 134 and an adaptive weight vector computer 136. The beamformer unit 132 is arranged to provide a non-adaptive polar gain characteristic to the antenna 12 as determined from an output signal $S_{na}$ generated by the unit 132. The computer 136 and the unit 132 are user steerable for directing a field of view of the apparatus 100 towards a part of the scene 'S' of interest.

The converter unit 30 is connected to the beamformer unit 132, the vector computer 136 and the weight multiplier 38 and is arranged to provide them with digital signals $x_i(k)$ where i is the reference index for identifying each element 22 uniquely. The modulation unit 32 is connected to the multiplier unit 134 and is arranged to provide a modulation signal $S_m$ thereto. The multiplier unit 134 is connected to the vector computer 136 and to the weight multiplier 38 and is arranged to provide a modulated digital signal $x_{17}(k)$ thereto. The weight multiplier 38 incorporates an output for providing an output signal y. The signal y corresponds to radiation from the scene 'S' in which components of the radiation arising from sources of jamming and interference therein are at least partially cancelled.

Operation of the apparatus 100 will now be described with reference to FIG. 2. The array 20 rotates relative to the mount 24 through an angle of 360° around an axis n–n' as indicated by the arrow 26, thereby fully scanning it over the scene 'S'. Each element 22 receives radiation from the scene and converts it to a corresponding output signal $e_i$ which is amplified and passed to the processing unit 114; i is the reference index in a range of one to sixteen for identifying each element 22. In the unit 114, the converter unit 30 receives the signals $e_i$,digitises them to provide sixteen corresponding digitised signals $x_i(k)$.

The beamformer unit 132 receives the sixteen signals x(k), multiplies each of them by an associated weighting vector D to provide corresponding product terms and then sums the terms to generate the output signal $S_{na}$ therefrom. Operation of the beamformer unit 132 is described by Eq. 7:

$$S_{na}=D^H x(k) \qquad \text{Eq. 7}$$

where H denotes a Hermitian transpose.

The modulation unit 32 generates the modulation signal $S_m$ which it outputs to the multiplier unit 134. The unit 134 multiplies the signal $S_{na}$ input to it by the modulation signal $S_m$ to provide the modulated signal $x_{17}(k)$. The vector computer 136 and the weight multiplier 38 both receive the signals $x_i(k)$ and the signal $S_{na}$ in modulated form as $x_{17}(k)$, represented as seventeen combined augmented digitised signals $\tilde{x}_q(k)$ in the diagram where q is an index in a range of one to seventeen. The vector computer 136 receives the augmented signals x~(k) and calculates therefrom corresponding weighting vectors w which provide the apparatus 100 with an adaptive beamforming characteristic as described above for at least partially rejecting components in the signals x~(k) arising from interfering sources in the scene 'S' and enhancing components arising from wanted sources located in a direction in which the antenna 12 provides its greatest gain, namely its main beam direction. The weight multiplier 38 receives the vectors w, multiplies them by their respective augmented signals x~(k) to provide product terms and then sums the terms to generate the output signal y.

Processing performed in the unit 114 at least partially cancels components in the output y arising from radiation received at the array 20 from unwanted sources of interfering and jamming radiation in the scene 'S'. As a result, the output signal y corresponds predominantly to radiation received at the array 20 from wanted radiation emitting sources in the scene 'S'. Incorporation of the beamformer unit 132 into the apparatus 100 enables it to provide an enhanced jamming and interference rejection characteristics when providing the output signal y in comparison to the prior art apparatus 10 illustrated in FIG. 1 and described above. The enhanced characteristics arise primarily from signal preconditioning provided by the beamformer 132. Moreover, generation of a single modulated signal $x_{17}(k)$ in the apparatus 100 compared to generation of a plurality of signals $m_i(k)$ as in the prior art apparatus 10 reduces the amount of computation for the computer 136 of the apparatus 100 to perform when calculating the vectors w for achieving adaptive beamsteering.

In order to further explain operation of the apparatus 100 shown in FIG. 2, operation of the vector computer 136 and the weight multiplier 38 will now be described in more detail. The coefficients D of the beamformer unit 132 are selected by the vector computer 136 to provide:

(i) an enhanced polar gain with respect to the signal $S_{na}$ in a direction in which the array 12 is scanned; or (ii) an enhanced polar gain with respect to the signal $S_{na}$ in a direction different relative to a direction in which array 12 is scanned, for example so that a null is steered in a direction in which the array 12 is scanned.

Steering a null in the polar gain with respect to the signal $S_{na}$ in the direction in which the array 12 is scanned at a target provides the apparatus 100 with an optimum performance for rejecting interference compared to the prior art, whereas steering an enhanced polar gain with respect to the signal $S_{na}$ in the direction in which the array 12 is scanned provides a sub-optimal performance although still provides the apparatus 100 with some enhanced rejection of interference compared to the prior art.

The signal $S_{na}$ is multiplied in the multiplier unit 134 by the signal $S_m$ which is chosen to match expected dynamics of a weight solution for the apparatus 100. The modulated output signal $x_{17}(k)$ from the multiplier unit 134 together with the signals $x_i(k)$ are represented in the diagram by augmented signals x~((k). The signals x~(k) are then input to the vector computer 136 which calculates weighting vectors w. The vectors w are calculated according to Eq. 8:

$$w=\frac{\tilde{R}^{-1}\tilde{C}}{\tilde{C}^H\tilde{R}^{-1}\tilde{C}}g \qquad \text{Eq. 8}$$

where

C=a matrix of constraints determining mainbeam steering direction;

R=a covariance matrix of the augmented signals x~(k);

H=a Hermitian transpose;

g=a gain vector; and

~ denotes signal augmentation.

The computer 136 outputs the weighting vectors w which are then input to the multiplier 38 which performs a multiplying and summing function as described by Eq. 9:

$$y=W^H\tilde{x}(k) \qquad \text{Eq. 9}$$

where w is the weighting vector for each corresponding augmented signal x(k). The output signal y corresponds to radiation emitted from the scene 'S' with contributions from radiation emitted from the interfering sources at least partially attenuated therein.

The apparatus 100 provides an advantage over the prior art apparatus 10 in that it provides a polar gain characteristic with respect to the signal y that rapidly varies in time in such a way as to counteract contributions in the signal y from non-stationary interfering sources within specified sectors of a field-of-view of the antenna 12, and also to reduce contributions in the signal y from stationary interferers in all directions relative to the antenna 12. The apparatus 100 requires little more computation and training data than a conventional known adaptive sensor array apparatus for computing weighting vectors w.

Figure 3:
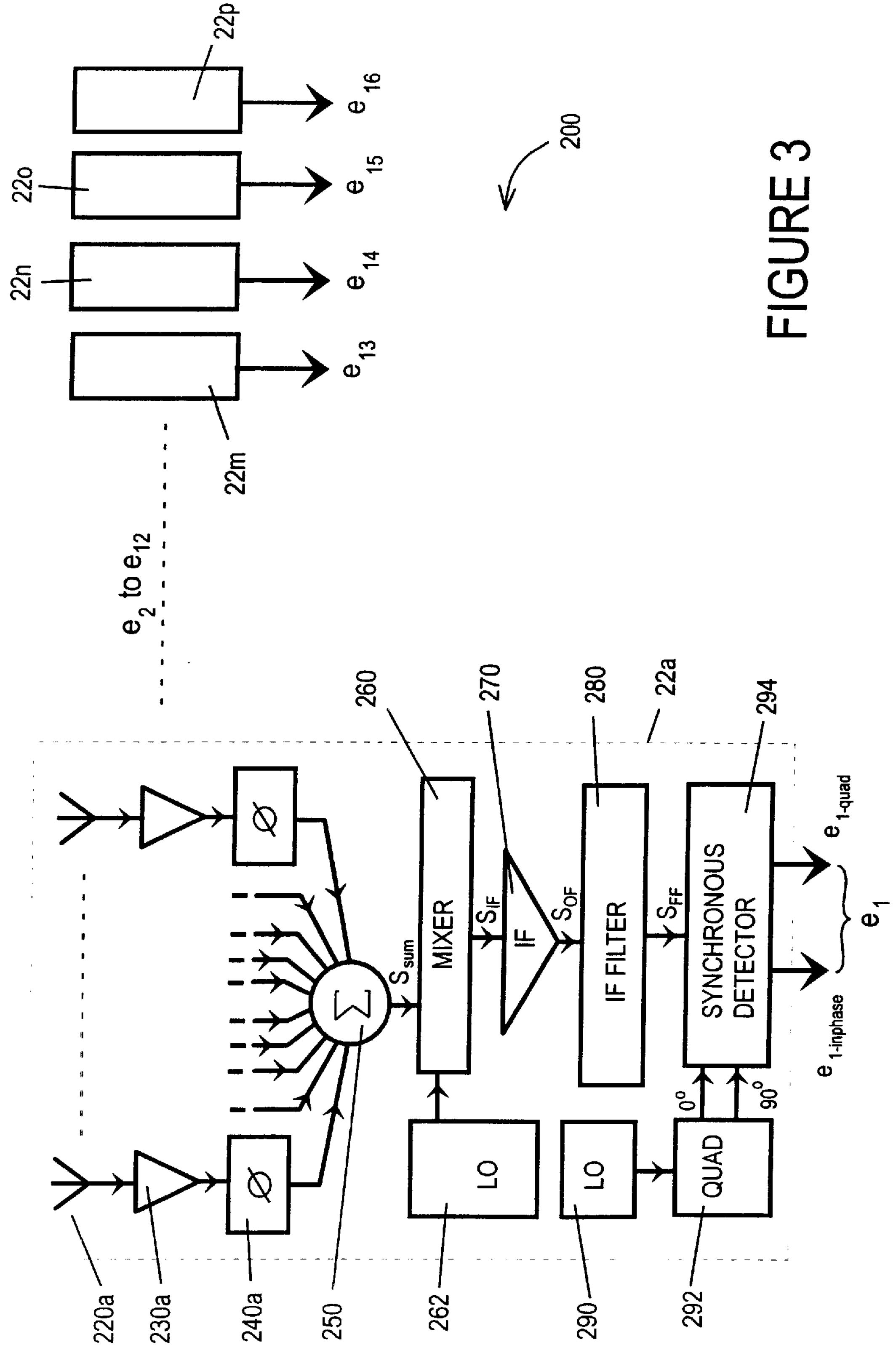
FIG. 3 is an schematic illustration of microwave antenna sensor elements incorporated into an antenna of the apparatus in FIG. 2.

Referring now to FIG. 3, there is shown a schematic illustration of the sensor elements 22, indicated generally by 200, incorporated into the antenna 12. There are sixteen identical antenna elements 22*a* to 22*p*; for clarity, only the elements 22*a*, 22*m*, 22*n*, 22*o*, 22*p* are illustrated in the diagram. The antenna 12 has an approximately circular aperture incorporating nine hundred and twenty eight waveguide type radiating dipoles, namely fifty eight dipoles for each element 22; for example the element 22*a* incorporates fifty eight microwave dipoles such as a dipole 220*a*, fifty eight microwave amplifiers such as an amplifier 230*a*, fifty eight phase shifting networks, such as a network 240*a*, a summing unit 250, a mixer unit 260 with an associated first local oscillator 262, an intermediate frequency (IF) amplifier 270, an IF bandpass filter 280, a second local oscillator 290, a quadrature generating unit 292 and a synchronous detector unit 294.

Each of the dipoles 220 is connected to an input of its associated microwave amplifier 230. Each of the amplifiers 230 has an output connected to an input of its associated phase shifting network 240. Each network 240 incorporates an output which is connected to an associated input of the summing unit 250. The unit 250 incorporates an output which is connected to a first input of the mixer unit 260. The first local oscillator 262 incorporates an output which is connected to a second input of the mixer unit 260. The mixer unit 260 incorporates an output which is connected to an input of the IF amplifier 270. This amplifier 270 includes an output which is connected to an input of the IF filter 270. The filter 270 incorporates an output which is connected to a first input of the synchronous detector unit 294. The second local oscillator 290 includes an output which is connected to an input of the quadrature generating unit 292. The generating unit 292 comprises two outputs, namely an in-phase (0°) output arranged to provide an in-phase signal and a quadrature phase (90°) output arranged to provide a signal which is in quadrature phase with respect to the in-phase signal. The two outputs from the generating unit 292 are connected to second and third inputs of the synchronous detector unit 294 respectively. The detector unit 294 includes the output for outputting the analogue output signal $e_1$ as described above. The signal $e_1$ comprises two sub-signals, namely an in-phase sub-signal $e_{1\text{-}inphase}$ and a quadrature phase sub-signal $e_{1\text{-}quad}$.

Operation of the antenna sensor elements 200 will now be explained with reference to FIG. 3. In operation, the elements 22 are rotated continuously about the axis n–n' to obtain 360° surveillance of the scene 'S'. Microwave radiation emitted towards the scene 'S' and subsequently reflected therefrom is received at the dipoles 220 incorporated into each of the elements 22. Referring to the element 22*a*, each dipole 220 generates a dipole signal in response to the microwave radiation incident upon it. Each amplifier 230 receives the dipole signal from its respective dipole 220 and amplifies it to provide an amplified output signal therefrom. Each phase shifting network 240 receives the amplified output signal from its respective amplifier 230 and phase shifts it for beam steering purposes to provide a phase shifted output signal therefrom. The summing unit 250 receives and sums the phase shifted signals from the networks 240 to provide a summed signal $S_{sum}$. The mixer unit 260 frequency downconverts the signal $S_{sum}$ by mixing it with a 3 GHz output signal from the first oscillator 262 to generate an IF output signal $S_{IF}$. The IF amplifier 270 receives the signal $S_{IF}$ and amplifies it to provide an output signal $S_{OF}$. The IF filter receives the signal $S_{OF}$ and filters it to provide an output signal $S_{FF}$.

For performing vector multiplication of the signal $e_1$ in the apparatus 100, the synchronous detector unit 294 receives the signal $S_{FF}$ and performs synchronous detection thereof using in-phase and quadrature local oscillator signals generated by the quadrature generating unit 292 from a local oscillator signal provided at the output of the second oscillator unit 290. The detector unit 294 thereby generates the signals $e_{1\text{-}inphase}$ and $e_{1\text{-}quad}$ as described above which are then output to the signal processing unit 114.

Figure 4:
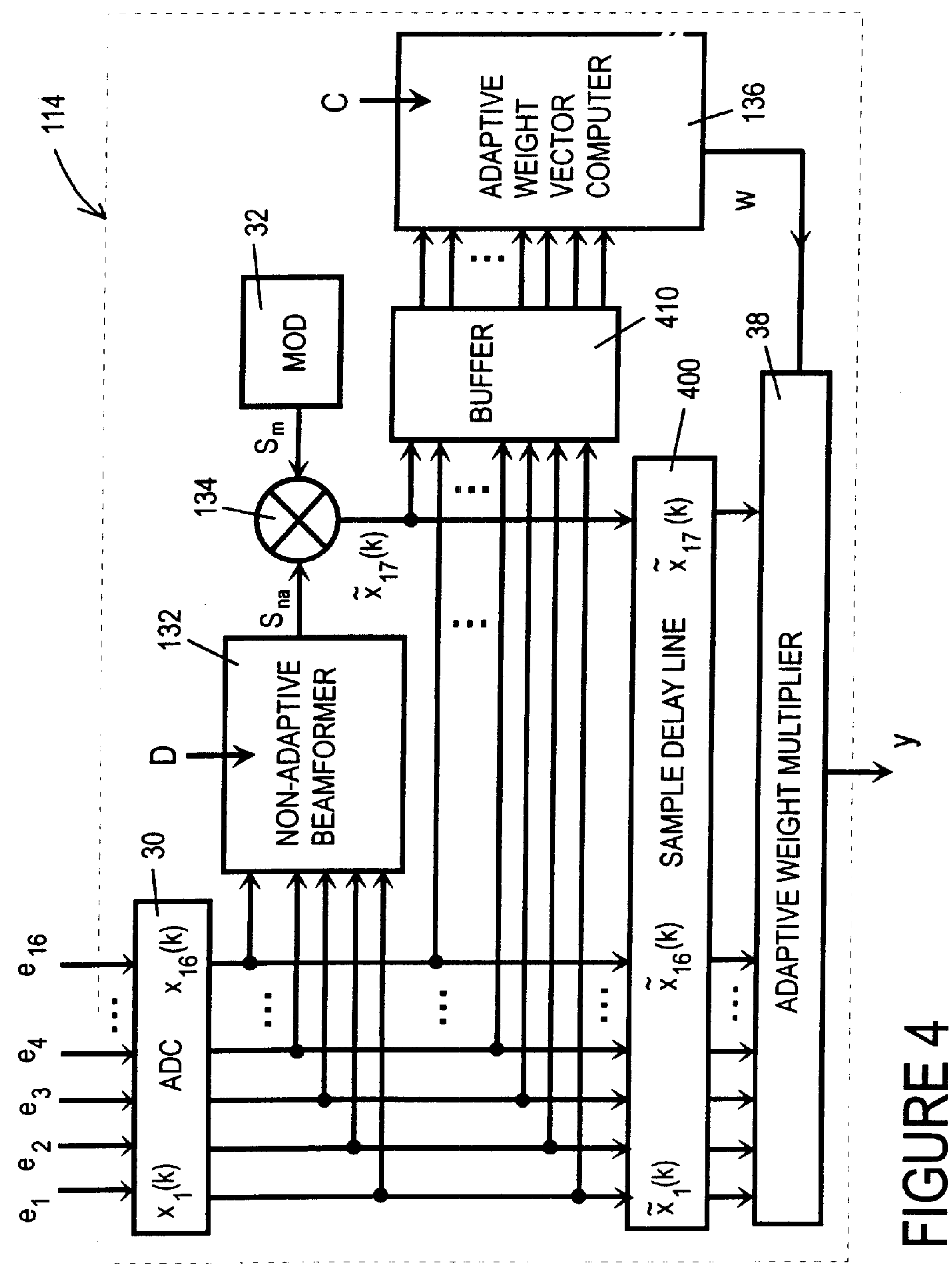
FIG. 4 is an illustration of a processing unit incorporated into the apparatus in FIG. 2.

Referring now to FIG. 4, there is shown a more detailed illustration of the processing unit 114 incorporated into the apparatus 100. The processing unit 114 comprises the converter 30, the beamformer unit 132, the multiplier unit 134, the modulation unit 32, the vector computer 136 and the adaptive weight multiplier 38.

The processing unit 114 also incorporates a sample delay line 400 and a buffer unit 410; these are not shown in FIG. 2 for clarity.

The converter 30 is arranged to receive in-phase and quadrature components of the signals $e_1$ to $e_{16}$ from the antenna 12. It incorporates digital outputs which are connected to the beamformer unit 132 as described above, to the buffer 410 and to the delay line 400. The beamformer unit 132 incorporates an output at which the digital output signal $S_{na}$ is provided and which is connected to the multiplier unit 134. The modulation unit 32 comprises an output at which the signal $S_m$ is output to the multiplier unit 134. The unit 134 includes an output at which the signal $x_{17}(k)$ is output. This output is connected to an input of the buffer unit 410 and to an input of the delay line 400. Outputs from the buffer unit 410 are connected to inputs of the vector computer 136. The computer 136 incorporates an output for outputting the calculated weighting vectors w. This output is connected to an input of the adaptive weight multiplier 38. Outputs from the delay line 400 are also connected to the weight multiplier 38. The multiplier 38 incorporates the output for the signal y.

Operation of the sensor elements 200 shown in FIG. 3 in conjunction with the processing unit 114 shown in FIG. 4 will now be described. The elements 22*a* to 22*p* receive radiation and generate the signals $e_1$ to $e_{16}$ in response thereto for the converter unit 30; each signal $e_i$ is provided as a corresponding in-phase sub-signal and a corresponding quadrature sub-signal. The converter 30 receives the signals $e_1$ to $e_{16}$ and digitises their sub-signals at a sampling rate of 100000 samples per second to provide the digital signals $x_1(k)$ to $x_{16}(k)$. The signals $x_1(k)$ to $x_{16}(k)$ are thereby updated at 10 μsec intervals. Each signal x(k) comprises a digital in-phase signal and a digital quadrature signal for conveying vectorial information of its associated signal $e_i$.

In operation, the antenna 12 is mechanically steered about the axis n–n' as described above and the weighting vectors D are supplied from the computer 136 to the beamformer unit 132 to control a steering direction of the antenna 12 in which it provides greatest sensitivity with respect to the signal $S_{na}$. The apparatus 100 is arranged to sense repeatedly in the steering direction for a sensing period of 8 msec before updating the steering direction; during the sensing period, the elements 22 transmit eight pulses of 3 GHz microwave radiation at a pulse repetition interval of 1 msec towards the scene 'S'. During the period, the antenna 12 receives reflected radiation from the scene and the apparatus 100 samples it at 10 μsec intervals to provide 100 sets of digital signals x(k) for each pulse. Transmitter units incorporated into the apparatus 100 for generating and transmitting the pulses are not illustrated in the diagrams as these units are of conventional design. The signals $x_1(k)$ to $x_{16}(k)$ are received at the processing unit 114 and are subsequently stored in the buffer unit 410 and the delay line 400. The delay line 400 and the buffer unit 410 provide an advantage of storing a number of signal samples for processing in the unit 114.

For explaining operation of the processing unit 114, the weighting vectors C provided by the vector computer 136 define the steering direction of the antenna 12 with respect to the output y. They may be represented by a matrix of sixteen matrix elements; when the steering direction is, for example, broadside to the antenna 12, the matrix elements are of unity value as given in Eq. 10:

$$C = \begin{bmatrix} 1 \\ 1 \\ \cdots \\ 1 \end{bmatrix} \quad \text{Eq. 10}$$

The matrix elements will be of non-unity value when the steering direction is moved away from broadside to the antenna 12.

Steering angles φ and θ will be used to represent orientation of a beam of the apparatus 100 relative to antenna 12 about the axis n–n' and elevation of the steering direction of the antenna 12 relative to an axis orthogonal to the axis n–n' respectively. During operation of the processing unit 114, the vector computer 136 calculates a matrix of weighting vectors denoted by D as provided by Eq. 11:

$$D = \frac{dC}{d\phi}\Big|_{\theta=0,\phi=0} \quad \text{Eq. 11}$$

The computer 136 calculates the weighting vectors C and D for values of the angles φ and θ from data tables stored in its memory. It is programmed to make the vectors C and D orthogonal to one another such that $C^H D=0$ by choice of phase reference, namely their real and quadrature parts; H here denotes a Hermitian transpose applied to the weighting vectors C.

Next, when the weighting vectors D have been calculated by the computer 136, the processing unit 114 then performs two functions, namely:

(i) a first function to form the augmented signals $x_1(k)$ to $x_{17}(k)$; and (ii) a second function to compute and apply the adaptive beamforming weighting vectors w.

In the first function, the unit 114 forms the augmented signals $x_1(k)$ to $x_{17}(k)$. The first sixteen signals $x_1(k)$ to $x_{16}(k)$ are the signals $x_1(k)$ to $x_6(k)$ respectively. The seventeenth signal $x_{17}(t)$ is generated by modulating the output signal $S_{na}$ from the beamformer un it 132 with the signal $S_m$.

The first function corresponds to generating a vector inner product of the weighting vectors D and the signals x(k). The signal $S_m$ is a time varying scalar as provided in Eq. 12:

$$S_m(k) = \beta\left[(k.\text{MOD}100) - \frac{99}{2}\right] \quad \text{Eq. 12}$$

where

β denotes a normalising constant;

MOD denotes a mathematical modulo operation; and k denotes sample time.

Thus, the signal $x_{17}(k)$ is given by Eq. 13:

$$\tilde{x}_{17}(k)=S_m(k).D^H x(k) \quad \text{Eq. 13}$$

In the first function, a fixed weighting vector applied to $x_{17}(k)$ at the adaptive weight multiplier 38 will result in the apparatus 100 time varying its steering direction because the signal $S_m$ used to generate $x_{17}(k)$ varies with the sample time k.

In the second function, the adaptive weighting vectors w are computed in the vector computer 136 and the weight multiplier 38 is arranged to vectorially multiply the signals $x_1(k)$ to $x_{17}(k)$ in successive blocks of 100 sets thereof, in other words, one set of weighting vectors w calculated for a radiation pulse emitted from the antenna 12 are used for multiplying sets of signals x(k) corresponding to that pulse.

The vector computer 136 employs a conventional adaptive beamforming algorithm for calculating the weighting vectors w. The algorithm comprises a Sample Matrix Inversion (SMI) algorithm which is arranged to perform the following computational steps:

STEP 1: The computer 136 incrementally sums successive sets of signals x(k) into a covariance summing matrix R according to Eq. 14:

$$R=R+\tilde{x}(k)\tilde{x}^H(k) \quad \text{Eq. 14}$$

where the matrix R is a 17 by 17 element sample covariance matrix for the 100 sets of the signals x(k) corresponding to their associated pulse.

STEP 2: The delay line 400 stores each successive set of the signals x(k) within it concurrently with the computer 136 performing STEP 1 above.

STEP 3: When 100 sets of the signals x(k) have been stored in the delay line 400 and incrementally summed by the computer 136 into the summing matrix R, the matrix R is normalised according to Eq. 15 to provide a normalised matrix $R_n$:

$$R_n = \frac{R}{100} \quad \text{Eq. 15}$$

STEP 4: The computer 136 computes an inverse matrix $R_n^{-1}$ of the normalised matrix $R_n$ from STEP 3 above. The matrix $R_n$ is always invertible when thermal noise is present in the signals x(k).

STEP 5: The computer 136 computes the weighting vectors w using Eq. 16:

$$w=R_n^{-1}\tilde{C}(\tilde{C}^H R_n^{-1}\tilde{C})^{-1} \quad \text{Eq. 16}$$

where Cis a constraint matrix defining mainbeam direction as given by Eq. 17:

$$\tilde{C} = \begin{bmatrix} C \\ 0 \end{bmatrix} \quad \text{Eq. 17}$$

The computer 136 is arranged to compute the weighting vectors w using Eq. 16 in three stages as given by Eq. 18, 19, 20, namely:

$$\text{matrix1}=R_n^{-1}\tilde{C} \quad \text{Eq. 18}$$

$$\text{matrix2}=\tilde{C}^H\cdot\text{matrix1} \quad \text{Eq. 19}$$

$$w = \frac{matrix1}{matrix2} \quad \text{Eq. 20}$$

STEP 6: The computer 136 outputs the weighting vectors w to the weight multiplier 38 which then multiplies each set of signals x~(k) supplied to it from the delay line 400 by the vectors w to provide product terms, and then sums the terms to generate the output signal y as given by Eq. 21:

$$y(k)=w^H\tilde{x}(k) \quad \text{Eq. 21}$$

The processing unit 114 incorporates Application Specific Integrated Circuits (ASIC) configured to perform STEPS 1 to 6 described above. Alternatively, the processing unit 114 may incorporate Field Programmable Gate Arrays (FPGA) configured to perform the steps; this provides an advantage that the apparatus 100 in this embodiment is reconfigurable by reprogramming the FPGAs. In a further alternative embodiment of the invention, the processing unit 114 may incorporate an array of Sharc processors for performing the steps; Sharc processors are a proprietary product with reference number ADSP2106x manufactured by a US company Analog Devices Inc.

In order to further explain operation of the apparatus 100, a simple numerical example of its operation will be described. In the example, only four of the sensors 22, namely sensors 22a, 22b, 22c, 22d, are employed. The sensors 22a, 22b, 22c, 22d are collinear in the antenna 12.

In the example, a target in the scene 'S' is located broadside to the antenna 12 and provides reflected radiation when interrogated therefrom. When received at the antenna 12 in the steering direction, the reflected radiation is of a power level which is 30 dB below a thermal noise power level of the apparatus 100. A jammer source is located at an angle of −26° relative to the steering direction and provides reflected radiation which is 40 dB above the thermal noise power level. Twenty samples of signals x(k) are received by the apparatus 100 as the antenna 12 is rotated on its mount 24 through an angle of 11°.

In the example, the computer 136 calculates the constraint vector C~ as given by Eq. 22:

$$C=\begin{bmatrix}1\\1\\1\\1\\0\end{bmatrix} \qquad \text{Eq. 22}$$

The computer 136 then calculates the weighting vectors D from Eq. 23 using Eq. 11:

$$D=\begin{bmatrix}-0.6708j\\-0.2238j\\0.2238j\\0.6708j\end{bmatrix} \qquad \text{Eq. 23}$$

In Eq. 23, j denotes a vector component in quadrature phase.

From the signals x(k) provided to the processing unit 114 from the antenna 12, the augmented signals x~(1), x~(2), for example, are calculated by the computer 136 as given in Eq. 24, 25:

$$\tilde{x}_1=\begin{bmatrix}-172.36+70.22j\\-170.90+76.18j\\-62.71+175.73j\\82.82+166.75j\\-266.81+287.83j\end{bmatrix} \qquad \text{Eq. 24}$$

$$\tilde{x}_2=\begin{bmatrix}-56.26-85.31j\\-20.37-99.43j\\-86.71-54.62j\\-99.23+24.54j\\-108.74+154.76j\end{bmatrix} \qquad \text{Eq. 25}$$

The computer 136 then sums the signals x~(k) as described in STEP 1 above to provide the covariance matrix R as given in Eq. 26:

$$R=10^4\times\begin{bmatrix}(1.2209) & (0.8765-0.8520j) & (0.0277-1.2199j) & (-0.8327+0.8949j) & (-0.2238-0.3850j)\\(0.8765-0.8520j) & (1.2243) & (0.8719+0.8570j) & (0.0268+1.2248j) & (-0.4169-0.1486j)\\(0.0277+1.2199j) & (0.8719+0.8570j) & (1.2216) & (0.8773+0.8544j) & (-0.4113+0.1487j)\\(-0.8327+0.8949j) & (0.0268-1.2248j) & (0.8773-0.8544j) & (1.2282) & (-0.2257+0.3809j)\\(-0.2238+0.3850j) & (-0.4169-0.1486j) & (-0.4113-0.1487j) & (-0.2257-0.3809j) & (2.8975)\end{bmatrix} \qquad \text{Eq. 26}$$

The computer 136 then performs STEP 2 to STEP 5 as described above to calculate the weighting vectors w as given in Eq. 27:

$$w=\begin{bmatrix}0.3621-0.2320j\\0.0904-0.0929j\\0.1821+0.0187j\\0.3655+0.3062j\\0.0185-0.0001j\end{bmatrix} \qquad \text{Eq. 27}$$

The computer 136 then outputs the weighting vectors w to the weight multiplier 38 which performs STEP 6 described above to generate the output signal y which is output therefrom. The signal y comprises an enhanced signal component arising from radiation emitted from the target and an attenuated signal component arising from radiation emitted from the jammer source. Selective attenuation and enhancement of signals arising from the target and the jammer source results from signal processing as described above performed in the processing unit 114.

Figure 5:
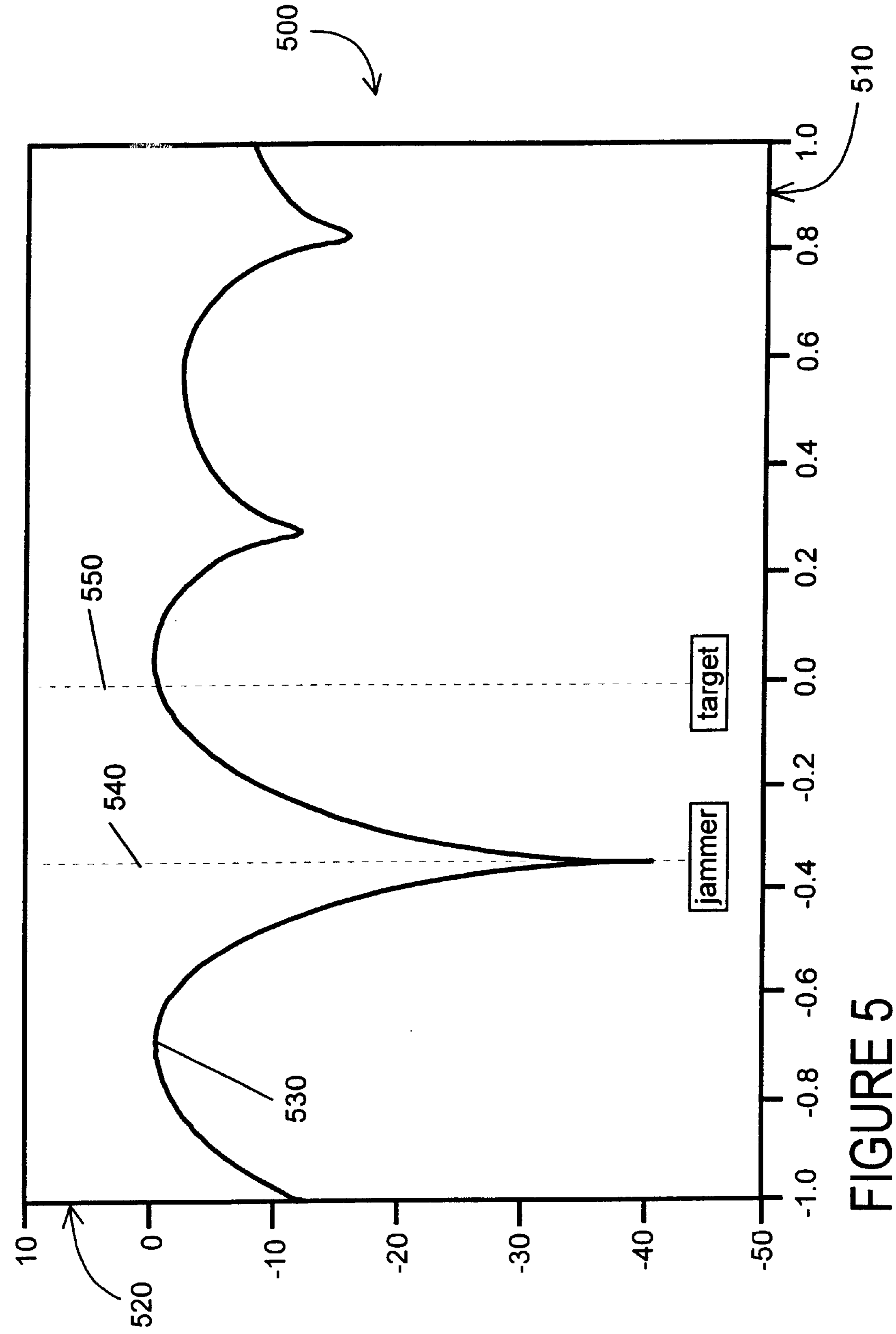
FIG. 5 is a graph illustrating an example polar gain response provided by the apparatus of the invention in FIG. 2.

FIG. 5 shows a graph of a polar gain response provided by the apparatus 100 using the weighting vectors in Eq. 27. The graph is indicated generally by 500. It incorporates a first axis indicated by 510 corresponding to a trigonometric sine of an angle relative to the steering direction, and a second axis indicated by 520 corresponding to polar gain in a direction at the angle from the steering direction relative to polar gain in dB provided in the steering direction. A dotted line 540 corresponds to angular position of the jammer source and a dotted line 550 corresponds to the steering direction. It is observed in the diagram that the apparatus 100 is effective at steering a null of −40 dB gain in its polar gain response towards the jammer source and a gain peak of 0 dB gain towards the target. Radiation from the jammer source is therefore largely rejected by the apparatus 100 whereas radiation from the target is accepted and processed to provide the output signal y. If selective attenuation of its response to radiation from the jammer source were not provided by the apparatus 100, the signal y would be swamped by the jammer source thereby rendering radiation from the target undetectable.

The antenna 12 may be modified to incorporate other numbers of elements 22 than sixteen elements described above. Moreover, each element 22 may incorporate other numbers of dipoles 220 than fifty eight described above.

The processing unit 114 may be arranged to process the signals $e_i$ in analogue form, thereby avoiding a requirement for the analogue-to-digital converter 30 to digitise the signals $e_i$. This provides an advantage that operation of the unit 100 is not limited to conversion rate of the converter 30.

The modulation unit 32 and the multiplier unit 134 may be arranged to generate a plurality of modulation signals $S_m$ and a plurality of corresponding modulated signals, for example $x_{17}(k)$, $x_{18}(k)$, $x_{19}(k)$, to augment the signals $x_i(k)$ from the converter 30. The plurality of signals $S_m$ may each be adapted to assist the apparatus 100 coping with a range of different platform trajectory dynamics.

What is claimed is:

1. An adaptive sensor array apparatus (100) for generating an output signal in response to received radiation, the apparatus (100) incorporating:

(a) multielement receiving means (12) for generating a plurality of element signals in response to received radiation;

(b) processing means (32, 34) for processing the element signals to provide corresponding augmented signals in which element signals with and without such processing are grouped;

(c) adaptive computing means (38, 136) for adaptively computing weighting vectors from the augmented signals, and for processing the augmented signals using the weighting vectors to provide the output signal, characterised in that the processing means (32) incorporates beamforming means (132) for preconditioning the element signals when generating the augmented signals to enhance interference rejection characteristics of the apparatus (100) when generating the output signal.

2. An apparatus (100) according to claim 1 characterised in that the beamforming means (132) is arranged to provide a first polar gain response for preconditioning the element signals and the apparatus (100) is arranged to provide a second polar gain response at its output signal, and a direction of enhanced gain in the first polar response is arranged to be aligned to a direction of enhanced gain of the second polar response.

3. An apparatus (100) according to claim 1 characterised in that the beamforming means (132) is arranged to provide a first polar gain response for preconditioning the element signals and the apparatus (100) is arranged to provide a second polar gain response at its output signal, and a direction of enhanced gain in the first polar response is arranged to be substantially orthogonal to a direction of enhanced gain of the second polar response.

4. An apparatus (100) according to claim 1 characterised in that the beamforming means (132) is arranged to provide a first polar gain response for preconditioning the element signals and the apparatus (100) is arranged to provide a second polar gain response at its output signal, and a direction of enhanced gain in the second polar response is arranged to be substantially in a direction of a null of the first polar response.

5. An apparatus (100) according to claim 1 characterised in that the processing means (32) is arranged to provide one or more processed signals and the apparatus (100) incorporates modulating means (134) for modulating the processed signals to provide one or more modulated signals for grouping with the element signals to provide the augmented signals.

6. An apparatus (100) according to claim 5 characterised in that it provides one modulated signal for grouping with the element signals to provide the augmented signals.

7. An apparatus (100) according to claim 4 characterised in that the modulating means is arranged to modulate the processed signal using a signal adapted to match dynamic response characteristics of a platform bearing the apparatus.

8. An apparatus (100) according to any preceding claim 1 characterised in that it incorporates analogue-to-digital converting means (30) for digitising the element signals to provide corresponding digital signals, and the beamforming means (38) and the computing means (136) are adapted to process the digital signals for generating the output signal.

9. An apparatus according to claim 1 characterised in that it incorporates data storing means (400, 410) for recording a plurality of sets of element signals, and the computing means (136) is arranged to calculate a corresponding set of weighting vectors from said sets of signals for use in generating said output signal.

10. A method of performing adapted beamforming in an adaptive sensor array apparatus (100), the apparatus (100) incorporating a plurality of receiving elements (22), the method comprising the steps of:

(a) generating element signals in response to radiation received at the elements (22);

(b) preconditioning the element signals by beamforming them and then processing them to provide corresponding augmented signals in which element signals with and without such processing and preconditioning are grouped; and (c) adaptively computing weighting vectors from the augmented signals, and processing the augmented signals using the weighting vectors to provide an output signal, thereby providing enhanced rejection in the output signal of contributions arising from interfering radiation received at the elements (22).

* * * * *

UNITED STATES PATENT AND TRADEMARK OFFICE

CERTIFICATE OF CORRECTION

PATENT NO. : 6,452,988 B1
DATED : Sept. 17, 2002
INVENTOR(S) : Hayward

It is certified that error appears in the above-identified patent and that said Letters Patent is hereby corrected as shown below:

Column 16,
Line 27, “adapted” should read -- adaptive --.

Signed and Sealed this

Twenty-first Day of January, 2003

JAMES E. ROGAN
*Director of the United States Patent and Trademark Office*